United States Patent [19]
Yonezu et al.

[11] 3,946,334
[45] Mar. 23, 1976

[54] INJECTION SEMICONDUCTOR LASER DEVICE

[75] Inventors: Hiroo Yonezu; Tonao Yuasa, both of Tokyo, Japan

[73] Assignee: Nippon Electric Company, Limited, Tokyo, Japan

[22] Filed: Nov. 13, 1974

[21] Appl. No.: 523,500

[30] Foreign Application Priority Data
Nov. 14, 1973  Japan................................ 48-131588

[52] U.S. Cl.......... 331/94.5 H; 29/591; 331/94.5 P; 357/18; 357/71; 357/81
[51] Int. Cl.²........................................... H01S 3/19
[58] Field of Search .................. 331/94.5 H, 94.5 P; 357/18, 71, 81

[56] References Cited
UNITED STATES PATENTS

| | | | |
|---|---|---|---|
| 3,303,432 | 2/1967 | Garfinkel et al...................... | 357/81 |
| 3,316,464 | 4/1967 | Hilsum........................... | 331/94.5 H |
| 3,551,842 | 12/1970 | Nelson................................. | 357/71 |
| 3,576,501 | 4/1971 | Deutsch........................ | 331/94.5 H |
| 3,691,476 | 9/1972 | Hayashi........................ | 331/94.5 H |

OTHER PUBLICATIONS

Hutchins, "Copper Mesa Heat Sink . . . ", IBM Tech. Discl. Bull. Vol. 17, No. 1, June 1974, p. 282.

*Primary Examiner*—William D. Larkins
*Attorney, Agent, or Firm*—Hopgood, Calimafde, Kalil, Blaustein & Lieberman

[57] ABSTRACT

An injection semiconductor laser having an active region normal to the reflecting surfaces includes an ohmic metal film on the side of the heat sink near the active region. The ohmic metal film is plated with a layer of a thermally conductive material. The shape and dimensions of the plated layer are selected to protect the laser from being damaged when the laser device is bonded to the heat sink, and also to prevent light rays emerging through one of the reflecting surfaces from impinging on the surface of the heat sink.

5 Claims, 5 Drawing Figures

U.S. Patent    March 23, 1976    3,946,334
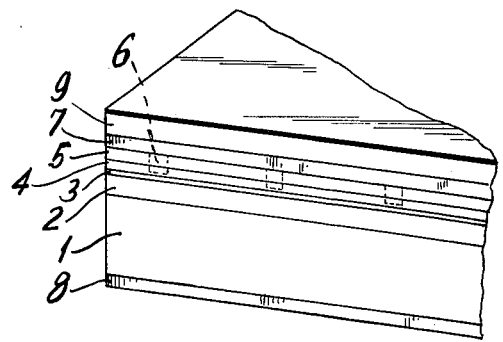
FIG.1
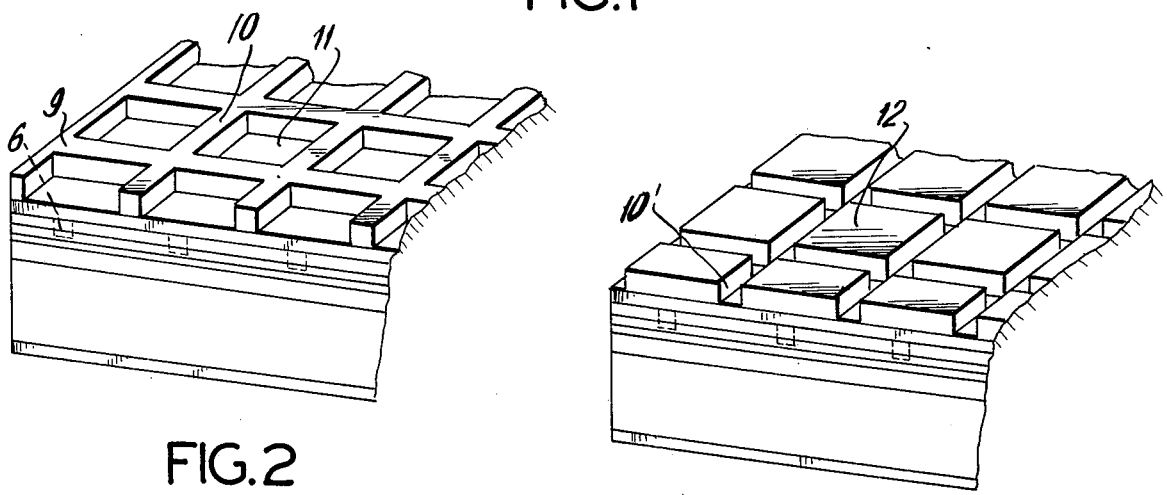
FIG.2
FIG.3
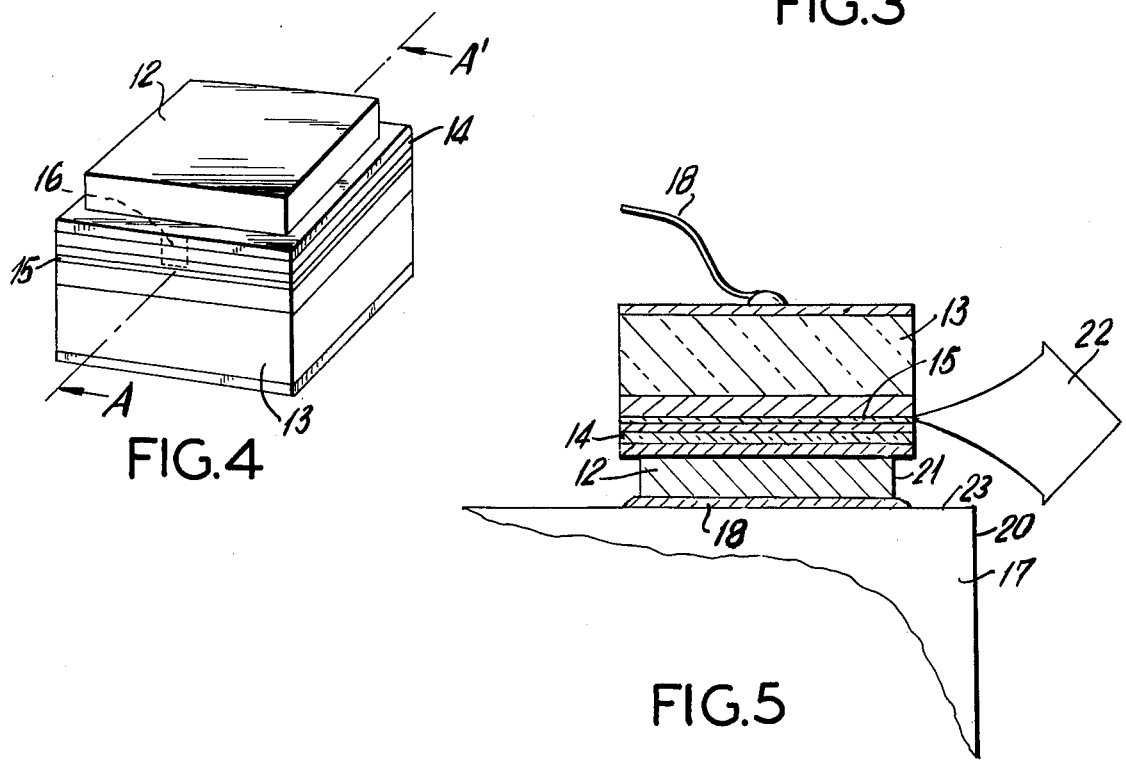
FIG.4
FIG.5

INJECTION SEMICONDUCTOR LASER DEVICE

The present invention relates generally to semiconductor lasers, and more particularly to stripe-geometry injection semiconductor lasers.

Continuous laser oscillation has recently been achieved at room temperature by the use of a double heterostructure laser. The life of the laser element has been extended by those working in this area of technology, such as the inventors hereof, and by the staff of Bell Telephone Laboratories. A continous laser oscillation of over 10,000 hours, with an output in the order of 10 milliwatts, is expected. Various types of stripe-geometry semiconductor lasers have recently been introduced which have contributed to an improvement in the control of oscillation modes. Despite these efforts, however, no practical injection semiconductor laser has yet been developed, and several problems in such lasers still remain unsolved.

One problem is the excess stress exerted on the laser element while the element is being bonded to the heat sink in the packaging process, which reduces the life of the laser element. Another problem is the low lasing efficiency. In the stripe-geometry semiconductor laser, the active region is only several microns away from the heat sink, with the result that the output laser beam generated under a controlled mode impinges upon the surface of the heat sink and is dispersed, causing a complicated interference fringe. Moreover, the optical properties of the output laser beam are deteriorated and the efficiency of light coupling into a path of glass fibers is lowered. One solution to this problem has recently been proposed in which a heat sink comprising an ohmic metal film plated with gold, thick enough and longer than the laser element, is used.

A second problem, however, has not been solved as yet, except for laboratory experiments in which diamond heat sink is used. Since the edges of the diamond heat sink can be processed to strict squares, the laser element can be mounted on the heat sink with its reflecting end flush with an end of the heat sink. This approach, although useful in avoiding the dispersion of laser light, is impractical because of difficulties in the control of mounting accuracy. If the reflecting laser end is recessed behind the edge of the heat sink even to a very slight amount, the output laser beam is inevitably dispersed. If, on the other hand, the laser element is positioned several tens of microns over the edge of the heat sink, heat dissipation from the laser element is hampered and the junction temperature rises so high that the laser becomes unable to sustain continuous oscillation, and the structural stability of the element is deteriorated. Since, particularly in double heterojunction lasers, the beamdiverging angle in the direction normal to the junction plane is as large as about 60° to 80° at a point where the laser output is half its maximum value, the laser element, when mounted, must have its reflecting end controlled to come several microns inside an edge of the heat sink. In practice, such high accuracy can hardly be maintained in the mounting process. In addition, the prior art heterojunction lasers are impractical in view of achieving reproducibility.

It is an object of the invention to provide an injection semiconductor laser element having a layer which is capable of efficiently dissipating heat from the element and protecting the laser element from being damaged when it is mounted on a heat sink.

With this and other objects in view, the invention provides an injection semiconductor laser element having a thermally conductive layer which is not longer than the laser resonator and is capable of efficiently dissipating heat from the element. According to the invention, the thermally conductive layer is formed on the laser element so that an output laser beam emerging at an angle of divergence of about 60° to 80° is least dispersed, without the need for strictly controlling the positioning of the laser element on the heat sink. Furthermore, the thermally conductive layer is thick enough to prevent an excess stress from being exerted on the laser element during the mounting of the laser element into a package. The thickness of the thermally conductive layer is determined not to lower the heat sink efficiency.

One typically known double heterojunction laser includes an n-type $Al_xGa_{1-x}As$ layer about 5 microns thick, a p-type GaAs layer (active layer) about 0.2 micron thick, a p-type $Al_xGa_{1-x}As$ layer about 2 microns thick, and a p-type GaAs layer about 1 micron thick. These layers are formed in succession by epitaxial growth on an n-type GaAs substrate about 80 microns thick. An ohmic metal film of Au-Sn or Au-Ge is installed on the n-type GaAs substrate, and another ohmic metal film of chromium about 0.1 micron thick is formed on the p-type GaAs layer. This ohmic metal film is coated with a protective film of gold which is about 1 to 2 microns thick. A laser resonator is formed by cleaving the crystal layers together with the metal films. The gold film on the side of the p-type GaAs layer is bonded to a heat sink (also a positive electrode) by tin-soldering or by Au to Au thermocompression bonding. The heat sink is made of a material such as copper or diamond. A lead wire for the negative electrode is bonded to the ohmic metal film on the side of the n-type GaAs layer. In this structure, the distance between the heat sink and the p-type GaAs active layer is about 4 to 5 microns. When the angle of output beam divergence is 60° to 80°, the laser element must be mounted with its end surface recessed by 5 to 6 microns within an edge of the heat sink in order to prevent the output laser beam from being heavily dispersed by the surface of the heat sink. Accuracy of mounting of this high order can rarely be maintained by the presently known techniques, with the result that reproducibility and productivity of injection semiconductor lasers remain low. Furthermore, in practice, it is nearly impossible to process the heat sink to form a flawless right-angle edge, which should lie only several microns off the edge of the laser element.

If the gold layer on the p-type GaAs layer is made as thick as 10 to 20 microns instead of 1 to 2 microns, the active layer becomes remote from the heat sink and reduces the difficulty in positioning the laser element exactly on the heat sink. On the other hand, however, the gold layer is so thick that it is impossible to cleave this layer together with the crystal layers. If the cleavage is forced, the gold layer will be torn.

To maintain good heat dissipation, the laser element must have widest and closest contact with the surface of the heat sink through the 1 to 2 microns thick gold film in the neighborhood of the region where current is applied. Otherwise, the thermal resistance of the element becomes too high for continuous oscillation. Furthermore, when the laser element is bonded to the heat sink by way of the 1 to 2 micron thick gold layer, a large stress is exerted on the laser element when the bonding temperature is lowered to room temperature in the bonding process. This is because the expansion coefficient is different in the crystal layers, gold film, soldered metal, and heat sink. This stress deteriorates the characteristics of the laser element and reduces the life of the element.

The purpose of the heat sinking gold layer formed at room temperature, as experimented on a Gunn diode and on an IMPATT diode, is to preclude the stress produced in the bonding process and to allow the laser element to have close contact with the heat sink layer. More specifically, this heat sink layer is constituted of an ohmic metal layer which is plated with gold 1 mm square and several hundred microns thick. The heat sink is installed on an element of about 200 microns in diameter. The element is then mounted on a large heat sink by way of the gold heat sink layer. In this structure, the ohmic metal layer is in closest contact with the heat sink layer. Ideally, therefore, the injection semiconductor laser element should be provided with a gold-plated layer capable of preventing the output laser beam from being dispersed without deteriorating the thermal dissipation characteristic of the laser element.

To this effect, it is necessary that the ohmic metal layer be plated with gold that is not longer than the laser element, and that the distance between the end of the gold-plated layer and the reflecting end of the resonator be determined not to cause the thermal resistance to exceed a value where continuous oscillation becomes inoperable. Roughly, this requirement is satisfied when the condition $\Delta L/L \lesssim 0.1$ (where L stands for the length of the resonator, and $\Delta L$ the distance between the reflecting end of the resonator and the end of the gold layer) is established. In practice, if $\Delta L$ is too large, the temperature of the active region in the area having no contact with the thick gold layer is raised, the absorption is increased, the gain is reduced, and the threshold is increased, to make continous oscillation impracticable. As for pulse oscillation, if the pulse repetition rate or duty factor is not so large as to appreciably elevate the temperature, then the laser element may be considered practicable even when the condition $\Delta L/L \lesssim 0.1$ is not satisfied.

Stripe-geometry semiconductor lasers having the oscillation region limited to a stripe-shaped region are in use with the aim to reduce thermal resistance, control the traverse mode, and limit operating current, thus facilitating continuous oscillation. When the thickness of the gold-plated layer is greater than the width of the stripe region, a heat stream from the stripe region spreads in the gold layer and becomes wider than the width of the stripe region to a distance about the same as the width of the stripe. This is why it is not necessary for the gold layer to be brought into strictly close contact with the heat sink under a high pressure.

Substantially high efficiency of heat dissipation can be obtained when the thickness of the gold layer is larger than about one-third the width of the stripe, i.e., larger than 3 to 7 microns for a 10 to 20 micron wide stripe, for example, depending on the state of contact between the gold layer and the heat sink.

The ohmic metal layer is plated with gold at about room temperature, which prevents stress due to the difference in the thermal expansion coefficients between the laser element and the gold layer. Because the gold layer is thick enough, the laser element is well protected from the influence of thermal stress produced as a result of the temperature rise in the process of bonding the laser element to the heat sink. As a result, the life of the laser element is extended. According to the invention, the thickness of the gold layer should be about several microns for desirable laser characteristics.

In this structure, the distance between the active layer and the heat sink is extended and the ohmic metal layer is plated with gold to a length equal to or shorter than that of the resonator. As a result, the laser element can easily be mounted in position without the need to take care to prevent the output laser beam from being dispersed due to the heat sink, as opposed to the prior art arrangement in which the reflecting end of the resonator must be located 5 to 6 microns behind the edge of the heat sink. According to the invention, the resonator is mounted on the heat sink so that its reflecting end is located 3 to 4 microns behind the edge of the heat sink. The length on this recess corresponds to the distance between the ohmic metal layer and the active layer, plus the thickness ($t$) of the gold layer. For example, when the width (W) of the stripe region is 15 microns, it is sufficient for the thickness of the gold-plated layer to be about 20 microns for good heat sinking. When the length (L) of the resonator is 300 microns, the heat dissipation characteristic can remain nearly unaffected on the condition that $\Delta L = 20$ microns. Hence, when the reflecting end of the laser element is located about 25 microns inside the edge of the heat sink, the output laser beam can be prevented from being dispersed by the heat sink. In a practical laser element, the end of the gold layer is about 45 microns distant from the edge of the heat sink. This mounting condition is readily feasible, assuring substantial reproducibility.

The minimum thickness of the gold layer, which will require close contact between the laser element and the heat sink in the mounting process, is roughly several microns, depending on the width of the stripe region and the mounting conditions. It is desirable that the distance between the end of the gold layer and the reflecting end of the laser element be one-tenth of the length of the resonator.

Various methods are available to realize this laser element. In one method, the plating is achieved by vapor deposition and is shaped by selective etching techniques. This method, however, is not very practical. A method that is most desirable to achieve increased reproducibility and productivity is one in which only the necessary part is selectively plated. More specifically, to preclude the portion that is not to be plated, a photoresist film, such as that known in transistor and IC technology, is formed. A sputtered silicon dioxide film may also be used for this purpose. Metals such as aluminum and copper have recently become available for use as the plating material. According to the invention, any metal may be used for this purpose as long as the metal has a high thermal conductivity.

The invention will be described in more detail by referring to the accompanying drawings in which:

FIGS. 1 through 3 are perspective views illustrating steps of fabricating laser elements according to the invention;

FIG. 4 is a perspective view showing a semiconductor laser pellet provided according to the invention; and FIG. 5 is a cross-sectional view taken along the line A—A' of FIG. 4 of a semiconductor laser pellet and a heat sink for illustrating an embodiment of the invention.

FIGS. 1–3 illustrate the steps employed in the fabrication of a planar stripe-geometry laser element having a double heterostructure and including a metal layer thickly plated with gold.

In FIG. 1, an n-type $Al_{0.3}Ga_{0.7}As$ layer 2 about 5 microns thick, a p-type GaAs layer 3 (active layer) about 0.2 micron thick, a p-type $Al_{0.3}Ga_{0.7}As$ layer 4 about 2 microns thick, and an n-type GaAs layer 5 about 1 micron thick, are formed in succession by known continuous liquid-phase epitaxial techniques on an n-type GaAs substrate 1 having a [100] plane, about 80 microns thick. Stripe-shaped p-type Zn-diffused regions 6 each of which is 20 microns wide and perpendicular to the cleavage direction are formed at intervals of 200 microns across the laser crystal element through the n-type GaAs layer 5 to the p-type $Al_{0.3}Ga_{0.7}As$ layer 4 so that planar stripe-geometry laser pellets, each of which is 20 microns wide, are formed. An ohmic electrode 7 such as of chromium 0.1 micron thick for the diffused region 6 is formed on the entire surface thereof, and a protective film of gold 1.5 microns thick is deposited on the chromium layer. An Au-Ge (12 percent) layer 8 to serve as an ohmic electrode about 1 micron thick is formed on the n-type GaAs substrate 1, and a protective film of gold 1 micron thick is formed on the ohmic electrode layer 8. A positive type photoresist film 9, known commercially as Az-340, is applied onto the ohmic electrode 7 with a thickness of about 15 microns.

In FIG. 2, the photoresist film 9 is removed except at linear portions 10 each of which is 20 microns wide and spaced 200 microns from each other, thereby forming a lattice pattern. This process is carried out by known exposure, development and fixing techniques. Regions 11, each of which is 180 microns square with the photoresist removed, are formed so that a diffused stripe region 6 is located in the center of each region 11. The portions 10 where the photoresist film remains are oriented to the cleavage direction <110> of the crystal. The regions 11 are plated with gold by the use of a plating solution, such as that made by Japan Electroplating Engineers Ltd. In the electroplating method, the laser crystal is negative and the platinum electrode is positive in polarity. First, the laser element is placed in a strike solution for preliminary plating at a current density of 10 $mA/cm^2$ at a temperature of 40°C. Then the element is placed in the gold-plating solution, BDT-200, for plating at a current density of 4 $mA/cm^2$ at a temperature of 50°C. During this process, the solution is stirred. The plating speed is 13 $\mu$m/hour, at which the desired thickness of the gold layer is obtained in a predetermined time.

The plated gold should not be much thicker than the photoresist film at portions 10, or else the regions 11 will become inseparable from each other or linked to each other. The thickness of the gold film is preferably less than approximately 10 microns greater than that of the photoresist film.

The current density specified for the gold plating operation is the optimum value. At a current density that varies significantly from this value, the surface of the plated layer will become rough and non-uniform. A gold layer 12 (FIG. 3) about 20 microns thick is obtained on the region 11 by carrying out this plating process for about 1.5 hours.

FIG. 3 shows the laser structure after the completion of the gold plating process in which the remaining photoresist film 10 has been removed by acetone to leave regions 10; whereby regions 12 plated with gold about 20 microns thick, each being 180 microns square and spaced 20 microns from each other, are formed.

FIG. 4 shows a laser pellet obtained by separating the laser crystal element shown in FIG. 3, by cleavage along the center of region 10' (FIG. 3) of 20 microns in width, which are not plated with gold. When a pulse current of a value above the threshold is supplied to the pellet, laser oscillation occurs in the active region 15 below the Zn-diffused region 16 (FIG. 2) in the direction perpendicular to the reflecting surfaces 13 and 14.

FIG. 5 is a cross-sectional view taken along line A—A' of FIG. 4, in which the laser pellet is bonded to a heat sink (as well as positive electrode) 17 by way of an Sn layer 18, and a negative electrode lead wire 19 is bonded to the other side thereof. The distance between the end 20 of the heat sink 17 and the end 21 of the gold-plated layer 12 is about 20 microns and thus the need for strictly controlling the mounting position for the element is eliminated. In experiments with the laser as fabricated in this manner, the threshold current with DC excitation at room temperature was 150 mA in the element with its heat sink connected to a larger heat sink. The angle of divergence was 70° for the output laser beam at half its maximum value, with the result that the laser output beam 22 was least dispersed by the surface 23 of the heat sink. In this example, $t = 20$ $\mu$m, $\Delta L = 10$ $\mu$m, $L = 200$ $\mu$m, and $W = 20$ $\mu$m, which satisfy the condition required for the plated layer. In the planar stripe-geometry laser, a fundamental traverse mode can be obtained when the width of the stripe is smaller than 20 microns. Hence, in experiments, the output laser could be efficiently coupled to glass fibers and transformed into a quasi-parallel beam through a lens system. In FIG. 5, the end 21 of the gold-plated layer may be expanded downward, or may be narrowed as long as a normal heat sinking characteristic is maintained. Because the laser elements are formed by photoresist techniques, high forming and mounting accuracy is maintained in the fabrication of the laser elements.

An example of planar stripe-geometry laser using a $GaAs-Al_{0.3}Ga_{0.7}As$ double heterojunction semiconductor has been described. However, the invention is not intended to be limited to this example, but is also applicable with similar advantage to other stripe geometry lasers using double-double heterojunction or single heterojunction structure. Instead of the planar stripe geometry, other geometry types such as the silicon dioxide type as described in Applied Physics Letters, vol. 18, No. 4, pp. 155 to 157, 1971, mesa type described in Applied Physics Letters, vol. 20, No. 9, pp. 344 to 345, 1972, and proton implantation type as introduced in Proceedings of IEEE, vol. 60, No. 6, pp. 726 to 728, 1972, may be used. Also, instead of the photoresist film used in the selective plating, other films such as a silicon dioxide film may be used. Further, instead of the selective plating, the entire surface thereof be plated when the laser element is cleaved before the plating process. In such case, the end of the plated layer is nearly exactly flush with the reflecting end of the laser element (where $\Delta L = 0$).

In addition, instead of gold, other materials may be used for plating, as long as the foregoing thickness and length conditions are satisfied. Furthermore, the reflecting surfaces and separation of pellets may be carried out by etching instead of by cleaving.

It will thus be appreciated that the description of the invention specifically provided herein is given for purposes of example only, and that modifications may be made therein without necessarily departing from the spirit and scope of the invention.

What is claimed is:

1. In a stripe-geometry semiconductor laser device of the type including a pair of parallel, smooth, flat reflecting surfaces forming an optical resonator, and an elongated laser-active region normal to the reflecting surfaces, the improvement which comprises: an ohmic metal film on the side of a heat sink near said laser-active region plated with a thermally conductive layer, wherein said thermally conductive layer is shorter than the optical resonator and is of a sufficient thickness to protect the laser device from being damaged in the process of bonding the laser device to the heat sink, thereby to facilitate the control of mounting accuracy and prevent output light rays emerging through one of the reflecting surfaces from impinging upon the surface of the heat sink.

2. The laser device of claim 1, in which the end of said thermally conductive layer is inward of the reflecting end of the resonator by a distance $\Delta L$, where $0 < \Delta L/L \leq 0.1$, where $L$ is the length of the resonator.

3. The laser device of claim 2, in which said thermally conductive layer is made of gold.

4. The laser device of claim 3, in which the thickness of said thermally conductive layer is larger than about one-third the width of said laser active region.

5. The laser device of claim 3, in which the thickness of said thermally conductive layer is larger than 3 to 7 microns and in which the width of said laser active region is 10 to 20 microns.

* * * * *